United States Patent
Bedjaoui et al.

(10) Patent No.: US 10,305,147 B2
(45) Date of Patent: May 28, 2019

(54) METHOD FOR REVERSIBLE BONDING BETWEEN TWO ELEMENTS

(71) Applicant: COMMISSARIAT A L'ENERGIE ATOMIQUE ET AUX ENERGIES ALTERNATIVES, Paris (FR)

(72) Inventors: Messaoud Bedjaoui, Voreppe (FR); Sylvain Poulet, Fontaine (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 3 days.

(21) Appl. No.: 15/629,444

(22) Filed: Jun. 21, 2017

(65) Prior Publication Data

US 2017/0373350 A1 Dec. 28, 2017

(30) Foreign Application Priority Data

Jun. 24, 2016 (FR) .................................. 16 55914

(51) Int. Cl.
*C09J 7/20* (2018.01)
*C23C 16/40* (2006.01)
(Continued)

(52) U.S. Cl.
CPC ........... *H01M 10/0585* (2013.01); *C09J 7/20* (2018.01); *C23C 16/401* (2013.01);
(Continued)

(58) Field of Classification Search
CPC ... C09J 2205/302; C09J 7/20; H01L 21/2007; H01M 10/0525; H01M 10/0585;
(Continued)

(56) References Cited

U.S. PATENT DOCUMENTS

| 6,821,376 B1 * | 11/2004 | Rayssac | ............ H01L 21/67092 |
| | | | 156/382 |
| 7,902,038 B2 * | 3/2011 | Aspar | ................... B81C 99/008 |
| | | | 257/629 |

(Continued)

FOREIGN PATENT DOCUMENTS

| FR | 2 796 491 A1 | 1/2001 |
| FR | 2 823 599 A1 | 10/2002 |

(Continued)

OTHER PUBLICATIONS

English Translation of FR2823599.*

(Continued)

*Primary Examiner* — Sonya M Sengupta
(74) *Attorney, Agent, or Firm* — Oblon, McClelland, Maier & Neustadt, L.L.P.

(57) ABSTRACT

Method for reversible bonding between a first element and a second element, comprising the implementation of the following steps:
  a) producing at least one oxide layer on at least one first face of the first element or of the second element;
  b) joining the first face of the first element with the first face of the second element such that the oxide layer forms a bonding interface between the first element and the second element;
  c) disjoining the second element with regard to the first element by the application of a heat treatment under controlled humid atmosphere physically and/or chemically degrading the oxide layer.

19 Claims, 3 Drawing Sheets

(51) Int. Cl.
*H01L 21/20* (2006.01)
*C23C 16/455* (2006.01)
*H01M 10/0525* (2010.01)
*H01M 10/0585* (2010.01)

(52) U.S. Cl.
CPC .......... *C23C 16/403* (2013.01); *C23C 16/407* (2013.01); *C23C 16/45525* (2013.01); *H01L 21/2007* (2013.01); *H01M 10/0525* (2013.01); *C09J 2205/302* (2013.01); *H01M 2220/30* (2013.01)

(58) Field of Classification Search
CPC ............. H01M 2220/30; C23C 16/401; C23C 16/403; C23C 16/407; C23C 16/45525
USPC ............. 156/499, 583.1, 711; 29/239, 426.1, 29/426.2, 426.3, 426.4, 426.5, 426.6; 438/458
See application file for complete search history.

(56) References Cited

U.S. PATENT DOCUMENTS

| | | | |
|---|---|---|---|
| 9,437,473 B2 * | 9/2016 | Landru | ............... H01L 21/2007 |
| 2004/0222500 A1 | 11/2004 | Aspar et al. | |
| 2008/0309867 A1 | 12/2008 | Kampstra | |
| 2009/0262294 A9 | 10/2009 | Templier et al. | |
| 2011/0048611 A1 | 3/2011 | Carre et al. | |
| 2014/0325832 A1 | 11/2014 | Martin et al. | |

FOREIGN PATENT DOCUMENTS

| | | |
|---|---|---|
| FR | 2 893 750 A1 | 5/2007 |
| WO | WO 2014/037792 A2 | 3/2014 |

OTHER PUBLICATIONS

English Translation of FR2796491.*
English Translation of WO2014/037792.*
English Translation of Search Report of EP17177429.*
English Translation of Opinion of FR 2016-55914.*
English Translation of Response to Opinion of EP17177429.*
French Preliminary Search Report dated Feb. 24, 2017 in French Application 16 55914 filed on Jun. 24, 2016 (with English Translation of Categories of cited documents).

\* cited by examiner

METHOD FOR REVERSIBLE BONDING BETWEEN TWO ELEMENTS

TECHNICAL FIELD AND PRIOR ART

The invention relates to a method for reversible bonding between two elements, implemented in particular between two substrates of which one is thin and used as support for producing microelectronic devices. This method advantageously applies when the production of microelectronic devices implies the implementation of steps at high temperatures (greater than or equal to around 400° C.), for example when these devices correspond to lithium microbatteries.

The advent of connected and intelligent objects is continually in search of microelectronic devices with more and more complex shapes and constraints. Apart from the problems intrinsic to the components themselves, the introduction of thin (thickness less than around 500 μm) and ultrathin (thickness less than around 100 μm, or even less than around 50 μm) substrates as supports for producing microelectronic devices plays a vital role.

Nevertheless, thin and ultrathin substrates are extremely fragile substrates with regard to the multiplication and the sequencing of a multitude of technological steps necessary for the production of electronic and microelectronic circuits on these substrates.

One of the solutions for responding to this problem of fragility consists in bonding these thin and ultrathin substrates on rigid thick substrates compatible with conventional microelectronics methods.

A first method of bonding designated direct bonding, or molecular bonding, has been introduced in an industrial manner notably for the elaboration of SOI (Silicon On Insulator) substrates. It consists in placing in direct contact, without use of an intermediate layer, two elements characterised by two bonding surfaces sufficiently prepared in terms of flatness and particulate and organic contamination.

For example, the document FR 2 893 750 describes the implementation of a direct bonding between a substrate made of thin glass and a rigid thick substrate serving as support. After the technological steps of producing microelectronic devices on the thin glass substrate, the separation of the thin glass substrate with regard to the thick substrate is accomplished mechanically by the insertion of a blade between the two bonded substrates.

This technique nevertheless finds its limits notably in the case of substrates serving for the production of microelectronic devices, the production of which imposes the implementation of steps involving high thermal budgets, such as for example the deposition of active layers. As an example, the production of lithium micro-batteries necessitates the implementation of thermal annealings of the electrodes at temperatures of around 600° C. for several hours. Yet, the bonding energy of assemblies obtained by direct bonding, without intermediate layer, may substantially increase when these assemblies are exposed to such temperatures, which causes a permanent bonding of the bonded surfaces which can no longer be separated from each other without damage. In addition, the separation of the substrates necessitates the use of mechanical tools in frictional contact with these substrates, which can cause localised mechanical fragilities leading to a rupture of these substrates as well as the components produced on these substrates.

A separation carried out exclusively by mechanical action via the insertion of a blade presents a high risk of damaging the substrates, notably for very thin fragile substrates, for example formed of glass of less than 100 microns thickness.

The technique of intermediate bonding is an alternative technique for attaching two elements to offset certain drawbacks of direct bonding, notably enabling an easier disjoining between the elements. This bonding technique generally employs one or more intermediate layers, comprising for example adhesive polymers, arranged between the two surfaces to connect.

The document US 2011/0048611 A1 describes a method for bonding a substrate on a thick substrate through an adhesive elastomer layer and a method for separating the substrates by chemical process in the course of which the adhesive layer is destroyed by soaking the assembly in an ultrasound bath.

This method for separating substrates necessitates nevertheless an enhanced protection of the components present on the assembly in order to prevent any degradation in the ultrasound bath.

Furthermore, this type of bonding, which notably calls upon polymers as adhesive materials, is incompatible with the production of microelectronic devices that necessitate the use of high temperature (greater than around 400° C.) methods on account of the low thermal resistance of the adhesive materials used.

A disjoining by chemical action and/or micro-wave excitation necessitates using fluids, which requires producing beforehand cavities and/or flow channels on one of the bonded elements.

The use of an acid solution such as a solution of HF during the disjoining is very detrimental for certain substrates such as glass substrates, and imposes the use of a complete protection of the substrate that includes microelectronic devices in order that the acid solution attacks the bonding oxide without degrading the substrates bonded to each other. Finally, the use of micro-waves causes an embrittlement of certain substrates such as glass substrates of thickness less than 100 microns.

DESCRIPTION OF THE INVENTION

There thus exists a need to propose a method for reversible bonding between two elements, for example two substrates, which does not have the drawbacks of bonding methods of the prior art, that is to say forming an assembly of two elements that is compatible with the implementation of steps involving high thermal budgets, for example at temperatures greater than or equal to around 400° C., whatever the nature of the materials of the elements, which does not necessitate the employment of mechanical separation means which can damage the elements joined together, and which does not necessitate a particular protection of the elements and/or components which can be produced on the assembled elements nor particular preparation such as the production of flow channels or the functionalisation of the surfaces to be connected.

To do so, one embodiment proposes a method for reversible bonding between a first element and a second element, comprising at least:

a) producing at least one oxide layer on at least one first face of the first element and/or on at least one first face of the second element;

b) joining the first face of the first element with the first face of the second element such that the oxide layer forms a bonding interface between the first element and the second element;

c) disjoining the second element with regard to the first element by the application of a heat treatment physically and/or chemically degrading the oxide layer.

This method calls upon one or more intermediate layers forming the bonding interface between the first and second elements. Thus, even if the assembly formed of the two elements joined to each other is exposed to high temperatures, for example greater than or equal to around 400° C., the bonding energy is not modified to the point of causing a permanent bonding of the two elements.

In addition, the bonding interface is formed by at least one oxide layer which does not have the drawbacks of polymer based adhesive layers. In fact, such an oxide layer has good temperature resistance in the case of exposure of this layer to steps serving for the production of microelectronic components involving high thermal budgets such as the deposition of active layers for example by PVD (Physical Vapor Deposition) or CVD (Chemical Vapor Deposition).

Conversely, such an oxide layer also has the property of physically and/or chemically degrading when said layer is exposed to certain particular heat treatments such as a heat treatment under humid atmosphere (which causes a modification of the roughness of the oxide layer leading to a crumbling thereof) and/or heating by laser radiation (which causes an ablation of the oxide layer). It is this property specific to oxides that is used to achieve the disjoining of the two elements.

The use of a heat treatment to disjoin the two elements also makes it possible to avoid the systematic use of mechanical separation means, which can in certain cases damage the joined elements.

Finally, no particular protection is imposed by the implementation of the heat treatment since this treatment only degrades the oxide layer.

The method proposed herein does not necessarily assume a prior preparation of the surfaces of the two elements to bond (flow channels, surface functionalisation to modify the roughness or the hydrophilic character). The structures proposed are compatible with high temperature applications whatever the nature of the elements used (silicon, glass or other). The method of dismantling by humid heat does not present a risk of degradation of the two elements, thus guaranteeing, when the elements are substrates, an integrity of the microelectronic devices independently of the thickness of the receiving substrate and a re-use of the support substrate unlike standard dismantling methods (mechanical action, fluidic chemical action).

The temperature and the duration during which the heat treatment is implemented are adjusted to degrade sufficiently the oxide layer in order to enable a disjoining of the two elements. These parameters are adapted notably as a function of the different characteristics of the bonding interface: nature of the oxide used, thickness of the oxide layer, accessibility of the oxide layer, presence of potential other elements in the bonding interface, etc.

The disjoining of the second element with regard to the first element is obtained by the application of a heat treatment under controlled humid atmosphere, for example an atmosphere in which the relative humidity is greater than around 50%, or greater than around 80% or greater than around 90%. The control of this atmosphere may concern at least the relative humidity level to which the elements are exposed.

The first element and/or the second element may correspond to a substrate that may comprise or not microelectronic elements or components transferred onto and/or manufactured from this substrate. The term "substrate" designates any type of support, including wafer, or chip, or strip.

Advantageously, one of the elements (for example the first element) may be a thick support which is solid or hollowed out or instead perforated for example by several holes, and the other of the elements may be a thin support in particular suited for the production of microelectronic devices such as for example micro-batteries.

The method may further comprise, before step a), the formation of at least one opening through the first element and/or the second element.

The presence of at least one opening through the first element and/or the second element makes it possible to increase the surface of the bonding interface accessible during the heat treatment of step c) degrading the oxide layer, which makes it possible to reduce the duration necessary for the degradation of the oxide layer.

The method may further comprise, between steps b) and c), the implementation of a step of treating the first element and/or the second element.

The treatment step may comprise the production of at least one part of at least one microelectronic device on the second element and/or on the first element.

Moreover, the treatment step may be implemented at a temperature greater than or equal to around 400° C., and may correspond notably to a step of deposition of active layers of one or more microelectronic devices.

The microelectronic device produced may correspond to an energy storage device, for example a micro-battery and more particularly a lithium micro-battery, and/or an energy recovery device, for example a photovoltaic cell and more particularly an organic photovoltaic cell, and/or a display device, for example a light emitting diode and more particularly an organic light emitting (OLED) and/or a sensor and/or an actuator.

Generally speaking, the field of application of this method covers a wide range of microelectronic devices faced with the handling constraints of fragile substrates with regard to microelectronic methods. Thus, this method may be adapted to other microelectronic devices while respecting the specificities of each application.

The oxide layer may:
- comprise aluminium oxide, also called alumina, and/or titanium oxide and/or zirconium oxide and/or zinc oxide and/or silicon oxide (or more generally a metal oxide and/or a dielectric oxide), and/or
- be deposited on all the surfaces of the first element and/or the second element, and/or
- have a thickness less than or equal to around 100 nm, and/or
- be deposited by deposition of atomic layers from at least one organometallic precursor and a precursor comprising water molecules.

The heat treatment may be implemented under humid atmosphere and/or may comprise a heating by laser radiation of the oxide layer for example through one of the first and second elements.

A humid atmosphere may correspond to an atmosphere in which the relative humidity is greater than around 50%.

The heat treatment may comprise a heating by laser radiation of the oxide layer through one of the first and second elements, said one of the first and second elements which can be transparent with regard to the laser radiation.

In this case, the other of the first and second elements may comprise at least one layer capable of reflecting and/or absorbing the laser radiation.

The method may further comprise:
- before step b), the implementation of a plasma treatment, and/or
- between steps b) and c), the implementation of a heat treatment reinforcing the bonding energy between the first element and the second element, and/or
- before step c), the application of an electrostatic field on the first element and/or the second element.

The heat treatment reinforcing the bonding energy between the first element and the second element may be implemented at a temperature less than around 400° C. Alternatively, this heat treatment may be implemented at a temperature greater than around 400° C. depending on the nature of the oxide used to form the bonding interface, if the elements are compatible with such a temperature. The duration of the heat treatment is adapted as a function of the temperature at which this treatment is implemented.

The disjoining of the second element with regard to the first element may further comprise the application of a mechanical action and/or a jet of pressurised gas between the first and second elements. This mechanical action and/or this jet of pressurised gas are in this case used as assistance to the heat treatment degrading the oxide layer.

The dimensions of the first face of the first element may be greater than or equal to those of the first face of the second element.

The method applies for example for the production of solid lithium micro-batteries on substrates made of thin or ultrathin glass attached beforehand onto rigid thick substrates.

According to an advantageous embodiment, the method may comprise the successive steps consisting in:
- preparing a first thick substrate (thickness greater than around 500 μm) traversed by holes emerging on the two main surfaces of the first substrate;
- conducting a deposition of one or more layers of aluminium oxide on the first substrate so as to cover correctly and in a homogeneous manner at least one of the surfaces of the first substrate;
- transferring a second substrate made of thin or ultrathin glass onto the first substrate by placing in contact a first face of the second substrate with one of the faces of the first substrate covered beforehand with aluminium oxide in order to produce a bonding between the two substrates;
- manufacturing several microelectronic devices on the second free face of the second substrate;
- exposing the assembly produced to a humidity and temperature controlled environment so as to crumble the layer(s) of aluminium oxide and disconnect the second element with regard to the first element.

The adjustment of the parameters of the environment to which the assembly is exposed makes it possible to better manage the method of crumbling the layer(s) of aluminium oxide.

Generally speaking, the oxide layers are used in microelectronic devices to fulfil several functionalities and particularly the encapsulation of elements sensitive to air as in the case of lithium micro-batteries. However, the method described herein is based on the fact that an exposure of these oxide layers to adequate thermal budgets (for example a humid heat and/or a laser irradiation) causes a physical and/or chemical degradation of said layers. It is this degradation property, undesired for conventional applications, which is exploited in the dismantling of the assemblies elaborated according to the method described herein.

One of the applications targeted herein concerns particularly the production of light and flexible microelectronic devices on a final substrate of a thickness less than around 100 μm. In order to be free of mechanical constraints linked to the fragility of the final substrate, the final flexible and fragile substrates are transferred onto initial rigid substrates compatible with microelectronic methods while easily having available fragile substrates supporting the microelectronic devices.

A structure is proposed comprising two substrates and obtained by a method for reversible bonding characterised by producing a bonding interface that can be dismantled. The proposed method combines the advantages of direct bonding and intermediate bonding. The attachment of the fragile substrate onto a rigid substrate is carried out without use of adhesive polymer. Thus, it is possible to obtain the assembly by the placing in contact of one of the surfaces of the fragile substrate with one of the two surfaces of the rigid support via the bonding interface. This placing in contact may for example be carried out by a standard lamination method.

Advantageously and before conducting the bonding operations, the surfaces of the initial substrate may be entirely covered with layers of aluminium oxide.

On the other hand, the bonding energy of the assembly obtained may be easily increased by a plasma pre-treatment of the bonding surfaces or by a post heat treatment at low temperature (for example less than around 400° C.) for several hours. Similarly, it is possible to improve the bonding energy by the application of an electrostatic discharge on one of the bonding surfaces or instead on one of the two external faces of the assembly produced.

According to one of the possible options, the assembly obtained by bonding may potentially be used as conveyor system in the manufacture of a multitude of microelectronic devices calling upon complex methods. In particular, it is possible to make use of these assemblies despite technological steps based on high thermal budgets (a temperature greater than around 400° C. applied for one or more hours) unlike polymer based bonding techniques described in the prior art. This is notably the case of electrochemical devices of lithium micro-battery type of which the layers of electrodes (more particularly cobalt oxide) sometimes require electrochemical activation annealings at a temperature of around 600° C. for at least two hours. This type of application assumes the use of materials of substrates (fragile and rigid) with very similar thermal expansion coefficients (TEC) to prevent mechanical problems during the post-annealing method.

Apart from the interest of post-annealing in the formation of the active layers of the manufactured devices, the assemblies obtained have a major advantage in the improvement of the bonding energy hence making the assembly comprising the fragile substrate and the rigid substrate more robust with a view to sequencing the other technological steps.

Generally speaking, the oxide layer(s) may be deposited at low temperature (for example less than around 400° C.) and with a very low thickness (total thickness less than or equal to around 100 nm) by thin layer deposition techniques. Preferentially, the use of the ALD (Atomic Layer Deposition) technique, which mixes in a sequential manner an organometallic precursor, for example trimethyl aluminium (TMA) when the oxide layer comprises alumina, with a water vapour ($H_2O$) precursor makes it possible to produce oxide films of very high purity and of very low thickness.

Alternatively, the oxide layer(s) may be obtained by a plasma enhanced ALD method known as PEALD (Plasma Enhanced Atomic Layer Deposition).

The composition of the oxide obtained may be perfectly stoichiometric ($Al_2O_3$ in the case of alumina) or instead sub-stoichiometric ($Al_xO_yH_z$ in the case of alumina).

Initially, that is to say before the application of the heat treatment degrading the oxide layer, this or these layers of oxide are characterised by a very low roughness, for example less than around 0.1 nm RMS (Root Mean Square) and a very hydrophilic surface. Advantageously, these characteristics ensure a strong bonding energy between the two elements. In fact, the hydrophilic character of the oxide surfaces and the presence of water molecules in the method for manufacturing oxide films particularly favours the attractive forces, notably Van der Waals forces, between the two bonding surfaces of the two elements. This mode of bonding is favoured by the formation of hydrogen bonds between the two bonding surfaces thus ensuring a very high bonding energy.

The material of the oxide layer, notably aluminium oxide, produced at low temperature (less than around 400° C.) may be an amorphous oxide with a relatively high hydrogen content. This concentration of hydrogen may be adjusted as a function of the operating conditions for elaborating the layers, notably the deposition temperature. This phenomenon is more pronounced for oxide layers produced at temperatures less than around 150° C. (for example with a thickness less than or equal to around 50 nm), the hydrogen content of which is very high compared to films produced at temperatures greater than around 150° C. Although hydrogen bonds have an interest in the reinforcement of the bonding energy of the assemblies produced, they are on the other hand behind the destruction of the oxide layers. The atomic percentage of hydrogen in the material of the oxide layer may be greater than around 5%, and preferably comprised between around 5% and 20%.

In fact, the oxide layers exposed in a prolonged manner (from several minutes to several hundreds of hours) to an aggressive environment, for example formed by a very high level of water vapour (between 90% and 100% relative humidity) and a temperature of the order of 100° C., are characterised by a very high surface roughness (greater than around 10 nm RMS) compared to the initial oxide layer (roughness less than around 0.1 nm RMS). In addition, this modification of the surface state is accompanied by a crumbling, or fragmentation, of the oxide layer causing a very important degradation of said layer, leading to a dismantling of the bonding interface. It is this characteristic of crumbling of the oxide layers that may be exploited in the disjoining of the elements by chemical process implemented.

The first element may be characterised by the presence of holes which emerge on the bonding interface and laid out within the first element so as to increase the total surface to cover by the oxide layers without perturbing the bonding properties. This architecture has the advantage of multiplying the channels for drainage and infiltration of water vapour during the dismantling of the bonding interface after exposure.

Advantageously, the holes or drains made through the first element may be of micrometric size and be spaced apart from each other by one hundred of microns, thus constituting structures with drains characterised by structure ratios greater than or equal to 1. Generally, the geometric characteristics of the drains formed in the first element may be adjusted in order to better regulate the rate of degradation of the oxide layer, and if needs the dismantling of the bonding interface.

Optionally, the method for separating elements may be assisted by a mechanical action, such as the insertion of a blade or a wedge at the bonding interface, in order to better apprehend the element that supports the microelectronic devices. According to another alternative embodiment, the assisting action during the method for separating substrates may be obtained by a pressurised jet of dry air, nitrogen, argon, helium or instead water.

The basic principle of the separation of the second element with regard to the first element may consist in chemically dismantling the bonding interface without degradation of potential microelectronic devices arranged on the second element while maintaining the integrity of the first element for a potential re-use.

In an advantageous embodiment, the exposure of the oxide layers present at the bonding interface to an aggressive environment in terms of humidity and temperature causes a crumbling of said layers making it possible to disconnect the elements. The oxide used at the level of the bonding interface may correspond to any oxide or any combination of oxides characterised by a sufficient hydrogen content to achieve bonding between the elements and dismantling of the bonding interface by exposure to an aggressive medium in terms of humidity and temperature. This is for example the case of metal oxides, such as titanium oxide, zirconium oxide or zinc oxide, and dielectric oxides, such as semiconductor oxide, for example silicon oxide, or nitride oxide (for example a mixture of nitride and silica in chemical form $SiO_xN_yH_z$). These materials used in a unitary manner or in combination may be obtained by vacuum deposition methods such as ALD, PEALD or CVD.

The oxide layer may be geometrically limited by the surface of the first element and/or of the second element on which it is deposited.

BRIEF DESCRIPTION OF THE DRAWINGS

The present invention will be better understood on reading the description of exemplary embodiments given for purely indicative purposes and in no way limiting while referring to the appended drawings in which.

Identical, similar or equivalent parts of the different figures described hereafter bear the same numerical references so as to make it easier to go from one figure to the next.

The different parts represented in the figures are not necessarily represented according to a uniform scale, in order to make the figures more legible.

The different possibilities (alternative embodiments and embodiments) should be understood as not being mutually exclusive and may be combined together.

DETAILED DESCRIPTION OF PARTICULAR EMBODIMENTS

A method for reversible bonding between two elements according to a first embodiment is described below in relation with FIGS. 1 to 6.

Figure 1:
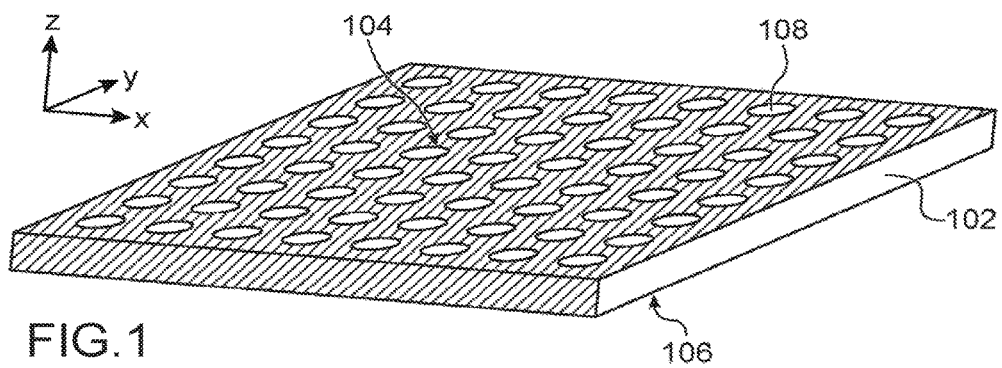
FIGS. 1 to 6 represent steps of a method for reversible bonding of two elements together according to a first embodiment.

A first of the two elements intended to be bonded in a reversible, or temporarily, manner to each other corresponds to a first substrate 102 such as represented in FIG. 1. This first substrate 102 here comprises glass and its thickness (dimension parallel to the Z axis in FIG. 1) is greater than or equal to around 500 µm. In the example of FIG. 1, the first substrate 102 has a rectangular shape such that the two main faces (or faces of the largest dimensions) 104, 106 of the first substrate 102 each have dimensions equal to around 12 cm×15 cm in the plane (X,Y). The first substrate 102 forms a thick rigid substrate intended to serve as support for the other element intended to be bonded in a reversible manner thereon.

The first substrate 102 comprises for example alkali-free borosilicate glass or instead alkaline earth boroaluminosilicate glass derived from alkaline rare earths.

In an alternative embodiment, the shape and/or the material of the first substrate 102 may be different. For example, the first substrate 102 may comprise a semiconductor such as silicon, or instead a ceramic.

A preparation of this first substrate 102 is firstly implemented. This preparation comprises the formation of holes (or drains) 108 through the entire thickness of the first substrate 102. The holes 108 thus emerge on the main faces 104, 106. In the exemplary embodiment represented in FIG. 1, the holes 108 each here have, in the main plane of the first substrate 102 (parallel to the plane (X,Y)), a disc-shaped section (each hole 108 thus having a cylindrical shape) of diameter equal to around 10 µm. The holes 108 are spaced apart from each other by a distance equal to around 500 µm. The ratio between the value of the distance separating two neighbouring holes 108 and the value of the dimension of the section of one of the holes 108, called structure ratio, is here equal to around 50.

Generally speaking, the holes 108 are preferably produced with a structure ratio greater than 1.

The holes 108 may be obtained either by the implementation of a chemical method of selective etching of the material of the first substrate 102, or by laser ablation.

Preferentially, the holes 108 are machined by any type of laser chosen as a function of the optical properties of the material of the first substrate 102. It may be for example a pulsed laser emitting in the ultraviolet (for example an excimer laser, or YAG), or in the near infrared or instead in the far infrared. For example, in the case of a first substrate 102 comprising alkali-free boroaluminosilicate glass and of thickness equal to around 500 µm, a $CO_2$ laser source having an emission wavelength equal to around 10.64 µm and used at a power of around 20 Watts may be used to form the holes 108.

In an alternative embodiment, the holes 108 may be produced by the implementation of chemical photo-lithography techniques. In this case, the first substrate 102 is firstly protected by a photosensitive resin except at the level of the zones that correspond to the locations of the holes 108, using dedicated masks. The etching of the holes 108 is next carried out in an aqueous solution, comprising for example sodium hydroxide (NaOH) or preferentially a solution based on hydrofluoric acid (HF).

The production of the holes 108 is followed by a method of chemical cleaning of the first substrate 102 in order to eliminate particulate etching residues as well as all potential organic contamination, and to confer a virtually perfect flatness (roughness less than around 1 nm RMS) to the surface of the first substrate 102 intended to be connected to the second element, that is to say here the surface of the first main face 104. The cleaning method consists for example in firstly soaking the first substrate 102 in detergent (soap) and ultrasound (two minutes) baths, then implementing several operations of rinsing with deionised water and carrying out drying under air of the surfaces of the first substrate 102. The operations of cleaning/rinsing/drying may be repeated several times up to the total elimination of the residues.

The surface of the first substrate 102 intended to be connected to the second element is next prepared for bonding.

Figure 2:
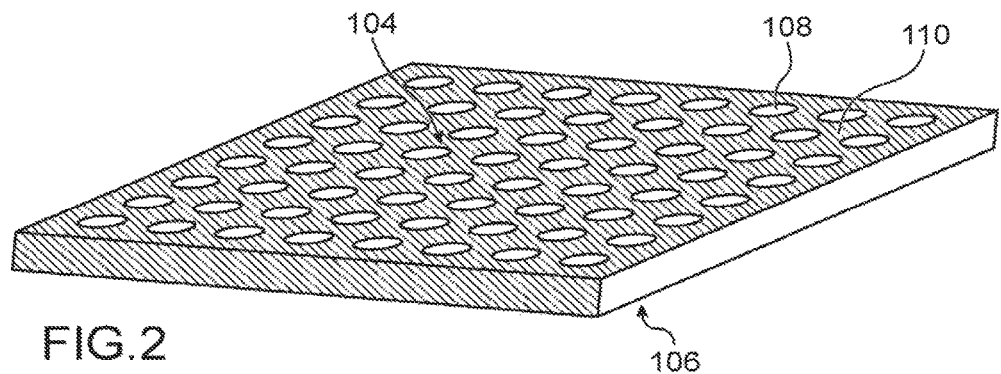

In the first embodiment described here, this preparation here consists in covering the entire surface of the first substrate 102, that is to say the surface of the first main face 104 but also those of the second main face 106, the lateral faces of the first substrate 102 (those perpendicular to the main faces 104, 106) as well as the surfaces exposed in the holes 108, by one or more oxide layers 110 intended to form the bonding interface between the first substrate 102 and the second element (see FIG. 2). In this first embodiment, a layer 110 of aluminium oxide, or alumina, is formed at the surface of the first substrate 102.

The layer 110 is here deposited by ALD from an organometallic precursor, for example TMA, and a co-reactive precursor, for example deionised water or water vapour ($H_2O$). The precursors are introduced sequentially in the deposition equipment used, beginning preferentially by the organometallic precursor, and while respecting a waiting time before purging the residues from the reaction. The waiting time represents the time of presence of the reaction species (organometallic precursors+co-reactive precursors) in the holes 108 of the first substrate 102. It is directly proportional to the value of the structure ratio characterising the dimensions and the density with which the holes 108 are formed in the first substrate 102. As an example, the waiting time may reach around 100 seconds for holes 108 with a structure ratio equal to around 1500.

Alternatively, the layer 110 may be deposited by PEALD.

The composition of the alumina layer 110 obtained by ALD at low deposition temperature (less than around 400° C.) may be perfectly stoichiometric ($Al_2O_3$) or instead sub-stoichiometric ($Al_xO_yH_z$).

In the first embodiment described here, the two precursors (TMA and $H_2O$) are firstly introduced one after the other with pulses of a duration of around 50 ms. A waiting time of around 5 s is next respected. A purging operation of a duration of around 10 s is next carried out. These operations are reproduced several times as a function of the desired number of deposition cycles, that is to say as a function of the desired thickness of the layer 110. Thus, for example around 250 cycles such as described above are necessary to deposit on the first substrate 102 an alumina layer 110 of a thickness equal to around 50 nm.

The total thickness of this layer 110 is for example comprised between around 1 nm and 100 nm, this thickness being adjusted by the number of deposition cycles carried out. The deposition temperatures are preferably comprised between around 80° C. and 400° C., and advantageously less than around 150° C. In this first embodiment, all the surfaces of the first substrate 102 are covered by the aluminium oxide layer 110 which has a thickness of around 50 nm obtained with the implementation of around 250 deposition cycles at a temperature equal to around 80° C.

The layer 110 obtained is characterised by a presence of hydrogen of the order of 18% expressed in atomic percentage, a density of the order of 2.65 g/cm$^3$ and a surface roughness less than around 0.3 nm RMS or even less than around 0.1 nm RMS.

In an alternative embodiment, only the surface of the first substrate 102 intended to be connected to the second element, that is to say the first main face 104 of the first substrate 102 in the example described here, may be covered with one or more oxide layers intended to form the bonding interface.

The following step corresponds to the bonding of the first substrate 102 (covered with the layer 110) with the second element which is here a second substrate 112. In this first embodiment, the second substrate 112 corresponds to a substrate of rectangular shape comprising ultrathin alkali-free boroaluminosilicate glass of thickness equal to around 50 μm and having a roughness less than or equal to around 1 nm RMS.

The second substrate 112 comprises for example alkali-free borosilicate glass or instead alkaline earth boroaluminosilicate glass derived from alkaline rare earths.

As for the first substrate 102, the shape and/or the material of the second substrate 112 may be different.

One of the faces of the first substrate 102, here the first main face 104, covered by the layer 110 is placed in contact with a first main face 114 of the second substrate 112. The bonding interface between the two substrates 102, 112 is formed by the layer 110. The placing in contact of the two substrates 102, 112 may be carried out by a so-called "sheet to sheet" lamination method, thus making it possible to expel air potentially entrapped between the two substrates 102, 112 in order to prevent the formation of bubbles. The placing in contact of the two glass surfaces is here carried out by a suitable lamination method (for example with a pressure comprised between around 1 bar and 3 bars, and rate of around 0.5 m/mn), which makes it possible in the end to obtain an assembly characterised by a bonding energy greater than around 500 mJ·m$^2$ and for example of the order of 1 J·m$^{-2}$.

Beforehand, the second substrate 112 is cleaned as previously described for the first substrate 102. Hence, the placing in contact of two identical surfaces in terms of flatness makes it possible to produce a bonding with a bonding energy.

A clamping comprising the application of an electrostatic field on at least one of the two substrates 102, 112, before or after placing in contact the surfaces of the substrates, may be carried out to favour the reinforcement of the bonding of the second substrate 112 with regard to the first substrate 102 thanks to the presence of electrons at the level of the insulating surfaces, and enabling a bonding energy which can reach around 1 J·$^{-2}$ to be obtained.

The bonding energy obtained may also be reinforced by implementing, before the bonding of the two substrates 102, 112, a plasma pre-treatment of the surfaces intended to be bonded, thus producing a surface activation increasing the surface energy by removal of contaminants on the surface or by reaction with these contaminants. For example, for a surface of silicon oxide, a N$_2$ plasma may be used.

The bonding energy obtained may also be reinforced by the implementation of a post-heat treatment, for example an annealing under controlled atmosphere of O$_2$/N$_2$/Ar or under air, at low temperature (for example less than or equal to around 400° C.) and for several hours (for example around 10 hours) on the assembly obtained.

The assembly of the substrates 102 and 112 is facilitated when these substrates comprise a same material, for example glass, or more generally materials having very similar or substantially equal TEC (for example a difference between the values of the TEC which is less than or equal to around 10%). In this case, the intrinsic thermal expansion of the second substrate 112 is substantially identical to that of the first substrate 102 during technological methods requiring an exposure of these substrates to high temperatures. In the example described here, the thermal and mechanical characteristics of the first substrate 102 and the second substrate 112 are virtually identical and given respectively by the values of the TEC (3.2×10$^{-6}$ K$^{-1}$) and the Young's modulus (74.8 kN/mm$^2$) of the glass of the first and second substrates 102, 112.

Figure 3:
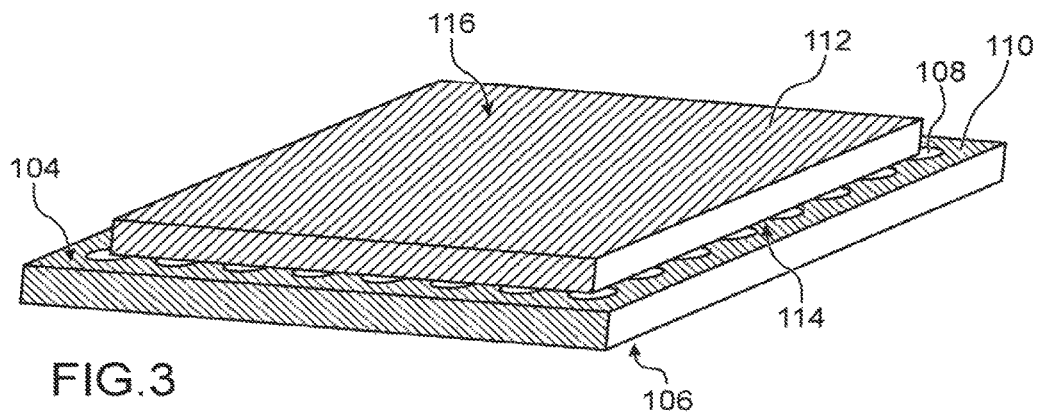
Figure 4:
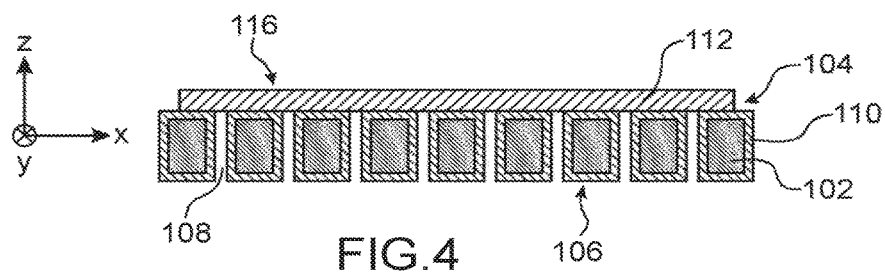
Figure 5:
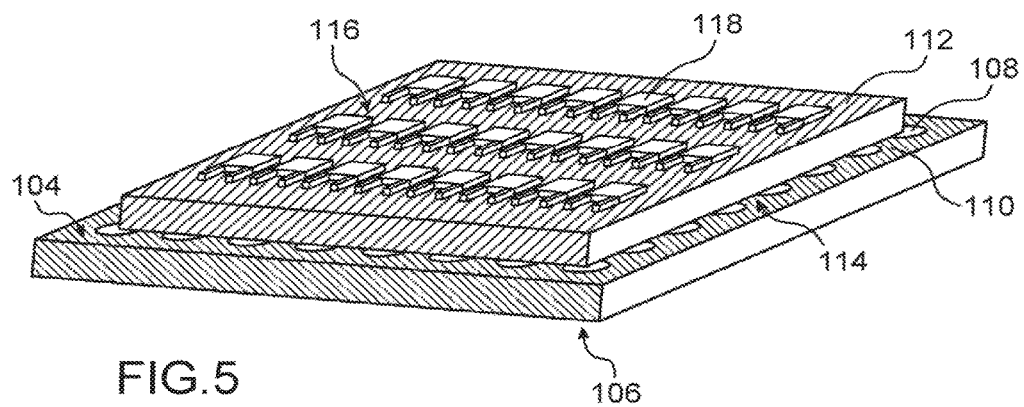

The assembly obtained is represented in FIGS. 3 and 4. FIG. 4 corresponds to a sectional view of the assembly obtained.

According to the preferential configuration as represented in FIG. 3, the second substrate 112 comprises, in the main plane of the second substrate 112 (plane (X,Y) in FIG. 3) a section such that the projection of this section in the plane of the first main face 104 of the first substrate 102 is inscribed in the section of the first main face 104. In the example of FIG. 3, the main faces 104, 106 of the first substrate 102 each have, in the plane (X,Y), a rectangular shape of dimensions equal to around 12 cm×15 cm, and the main faces 114, 116 of the second substrate 112 each have, in the plane (X,Y), a rectangular shape of dimensions less than those of the main faces 104, 106 of the first substrate 102 and equal to around 11 cm×14 cm. The second substrate 112 is substantially centred with respect to the first substrate 102.

A clamping is here carried out after placing in contact the two substrates 102, 112. A high voltage charge of 5 kV with positive polarity is applied to the surface of the first substrate 102 covered by the aluminium oxide layer 110 using a high electrostatic voltage charger. In parallel, an equivalent charge with opposite polarity is applied to the surface of the second substrate 112.

After the joining of the second substrate 112 to the first substrate 102, microelectronic devices are next produced on the second substrate 112. In the example represented in FIG. 5, the microelectronic devices produced correspond to electrochemical devices of solid lithium micro-battery type 118 produced on the second main face 116 of the second substrate 112.

Figure 6:
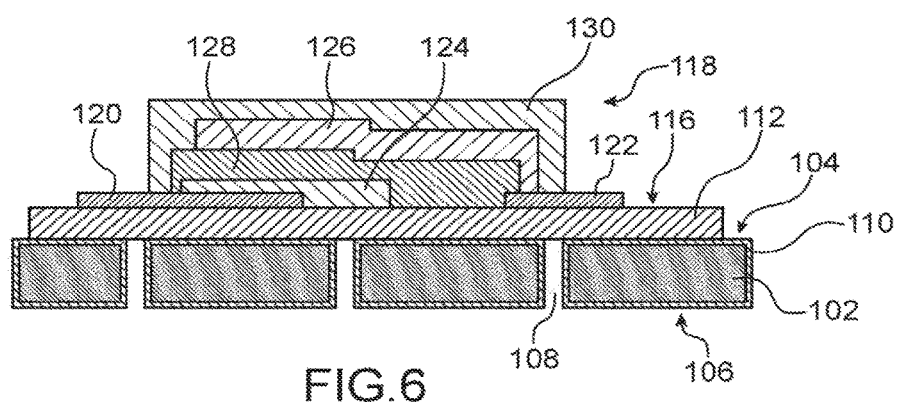

Generally speaking, a lithium micro-battery is obtained by the implementation of depositions of thin layers of PVD or CVD type. A sectional view of one of the micro-batteries 118 produced on the second substrate 112 is represented in FIG. 6. The micro-battery 118 comprises metal cathodic 120 and anodic 122 current collectors (comprising for example titanium, gold, aluminium, platinum, tungsten or any other suitable metal) arranged on the second glass substrate 112. The active layers of the micro-battery 118 form the two cathodes represented by the positive electrode 124 (cathode) and the negative electrode 126 (anode) electrically insulated from each other by an ionic electrolyte 128.

The positive electrode 124 has a thickness comprised between around 100 nm and 10 μm, and comprises a material having a good electronic and ionic conductivity (for example at least one of the following materials: TiOS, TiS$_2$, LiTiOS, LiTiS$_2$, LiCoO$_2$, V$_2$O$_5$, etc.). The deposition of these materials is carried out at temperatures which can exceed 400° C. and sometimes necessitates annealings at very high temperature (around 600° C. or even more) in order to activate all the electrochemical properties of these materials. This is the case of an electrode comprising $LiCoO_2$ deposited at a temperature of around 400° C. and annealed at around 600° C. for around 2h. Such thermal budgets are here advantageous because they make it possible to reinforce the bonding between the first and second substrates 102, 112, making it possible to attain bonding energies of around 4 J·m$^{-2}$.

The electrolyte 128 here has a thickness comprised between around 500 nm and 5 μm and forms an electronic insulator with high ionic conductivity. The electrolyte 128 comprises for example at least one of the following materials: LiPON, LiPONB, LiSiCON.

The negative electrode 126 corresponds to a thin layer of a thickness comprised between several nanometres and several tens of microns, and may be constituted exclusively of metal lithium or of an intentionally lithiated material.

An encapsulation layer 130 is present on the active layers 124, 126 and 128 notably on account of the very high reactivity of lithium and the lithiated layers with regard to the atmosphere. The encapsulation layer 130 may be produced in a monolithic or heterogeneous manner. As an example, the encapsulation layer 130 represented in FIG. 6 corresponds to a barrier layer of thickness equal to around 25 μm transferred by lamination or by sealing onto the whole of the micro-batteries 118 arranged on the second substrate 112. The encapsulation layer 130 corresponds for example to laminated films of aluminium/PET (polyethylene terephthalate)/adhesive type.

The method is completed by carrying out the separation of the second substrate 112 with regard to the first substrate 102 by degrading the layer 110.

This separation is here obtained by crumbling of the aluminium oxide layer 110, this crumbling being the consequence of an exposure of the layer 110, at the level of the lateral faces of this layer 110 and the parts of the layer 110 accessible from the holes 108, to a humidity and temperature controlled atmosphere which causes a very important modification of the surface roughness of the layer 110. In fact, a prolonged exposure of the layer 110 to a humid heat environment causes a modification of the physical-chemical properties of alumina accompanied by an increase in its surface roughness. For example, an alumina layer of 50 nm thickness deposited by ALD at a temperature of 80° C. exposed for several hours (for example around 5 hours) to a humid heat flux (100% relative humidity and 100° C.) is enriched by dangling hydroxyl bonds of OH type and carbonate bonds ($CO_3$). The roughness of the alumina, which is initially less than around 0.3 nm RMS after deposition, increases until reaching values that exceed 100 nm RMS, thus causing an important crumbling of alumina, enabling the detachment of the substrates 102, 112 from each other.

When the assembly produced previously is exposed in a humid environment as described above, the encapsulation layer 130 also ensures the protection of the devices 118 with regard to this environment. Optionally, the separation of the substrates 102, 112 may be carried out under controlled pressure in dedicated hermetic chambers such as an autoclave.

This separation may be assisted by a mechanical tool, such as for example a blade, making it possible to apprehend easily the second substrate 112 containing the devices 118.

After this separation, the first substrate 102 remains intact and may be recycled for the production of other assemblies.

Other examples of materials which can be used to form the oxide layer serving as bonding interface and which degrade when they are exposed to a humid heat are:

$Al_XO_YH_Z$, which can degrade when it is exposed to an atmosphere of which the relative humidity is at least 90% and at a temperature of at least 90° C.;

$TiO_XH_Y$, which can degrade when it is exposed to an atmosphere of which the relative humidity is at least 95% and at a temperature of at least 95° C.

In the materials cited above, the indices X, Y and Z correspond to the proportions of the different elements of these materials.

Figure 7:
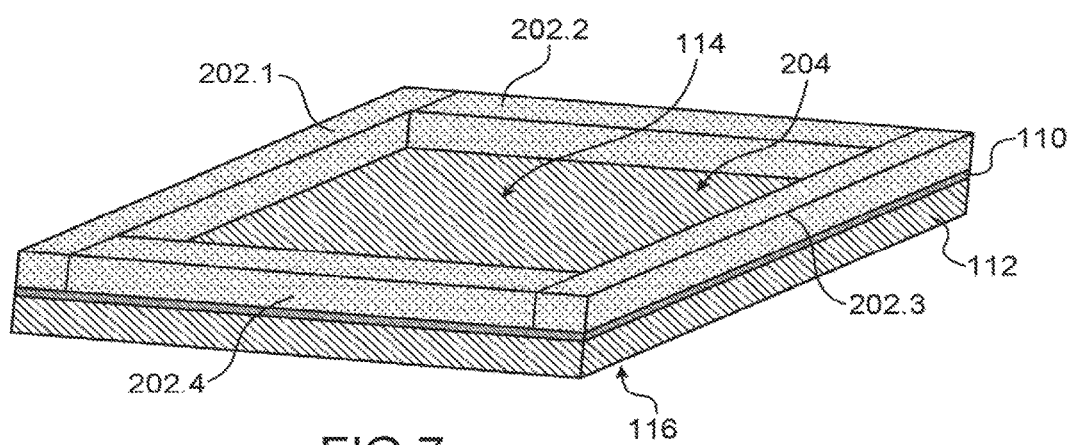
FIG. 7 represents an alternative embodiment of a first substrate bonded in a reversible manner to a second substrate by the implementation of a method for reversible bonding according to a second embodiment.

One or both elements 102, 112 connected to each other according to the method described previously may not correspond to substrates. Thus, in the example represented in FIG. 7, the first element 102 does not correspond to a layer of material forming a first substrate as in the first embodiment described previously, but to four portions of material 202.1-202.4, here comprising glass, and assembled together while forming a frame bonded to the layer 110 which is produced beforehand on the first main face 114 of the second substrate 112. The portions 202.1-202.4 form a layer traversed by an opening 204 forming an access to the layer 110.

The separation of the two elements 102, 112 is carried out in an analogous manner to the first embodiment, with nevertheless an easier access of the flow of heat to the parts of the layer 110 forming the bonding interface of which the surface is reduced with respect to the first embodiment described previously. This may result in a less long exposure of the different elements, and notably the devices 118, to the environment used to disconnect the two elements 202, 112 and which may be aggressive and damage the devices 118.

Moreover, in the first embodiment described previously, the dimensions of the second substrate 112 and the positioning of the second substrate 112 with respect to the first substrate 102 are such that, in the plane passing through the first main face 104 of the first substrate 102 to which the second substrate 112 is connected, a projection of the second substrate 112 in this plane is entirely included in the section of this first main face 104 of the first substrate 102. In an alternative embodiment, this projection of the second substrate 112 in this plane may be only partially included in the section of the first main face 104 of the first substrate 102. According to another alternative embodiment, the dimensions of the main faces 114, 116 of the second substrate 112 may be substantially equal to those of the main faces 104, 106 of the first substrate 102.

In the first embodiment described previously, the layer 110 serving to form the bonding interface between the first and second substrates 102, 112 is produced, prior to the joining of the two substrates 102, 112 together, on the surface of the first substrate 102. Generally speaking, the layer 110 serving to form the bonding interface between the first and second substrates 102, 112 may be produced, prior to the joining of the two substrates 102, 112, on at least one part of the surface of the first substrate 102 and/or on at least one part of the surface of the second substrate 112, and does so independently of the dimensions of the substrates 102, 112.

In the first embodiment described previously, the holes 108 are formed through the first substrate 102. In an alternative embodiment, it is possible to connect the substrates 102, 112 to each other while omitting to form these holes 108 through the first substrate 102. In this case, the separation of the substrates 102, 112 takes places thanks to an infiltration of the flow of humid heat, which takes place essentially at the level of the lateral flanks of the assembly.

In the first embodiment and the alternative embodiments described previously, the bonding interface between the substrates 102, 110 is formed by the layer 110 comprising aluminium oxide. In an alternative embodiment, this bonding interface may comprise one or more other oxides for example deposited in thin layers, and may correspond notably to a stack of layers.

For example, the bonding interface may be formed by depositing on the first substrate 102 or the second substrate 112, a layer 110 of zirconium oxide of thickness for example equal to around 10 nm by ALD from a sequential combination of organometallic precursors of tetrakis(dimethylamide)zirconium (TDMAZ) and water vapour ($H_2O$) type. The deposition method is similar to that described previously for the aluminium oxide layer, the organometallic precursor TMA being replaced by TDMAZ and the zirconium oxide layer being obtained by implementing around 100 deposition cycles. In these conditions, the $ZrO_2$ layer obtained at a temperature of around 80° C. is amorphous with a density of the order of 5.9 g/cm$^3$, a surface roughness less than around 0.5 nm RMS and a hydrogen content of the order of 10% (atomic percentage).

Generally speaking, it is possible that the bonding interface is constituted of an alternation of several oxides fulfilling the conditions necessary for the bonding of the elements 102, 112 and the dismantling by exposure to a heat treatment capable of degrading these oxides (for example thanks to a humid atmosphere).

Moreover, an alternative or complementary solution for degrading the oxide layer 110 and separating the substrates 102, 112 from each other, notably when one of these two substrates corresponds to a fragile glass substrate of thickness less than or equal to around 100 μm and that the other of the two substrate corresponds to a rigid glass substrate of thickness greater than or equal to around 500 μm, consists in using a laser light source. In this case, the assembly of the two substrates 102, 112 is for example obtained by depositing on the first rigid substrate 102 a first metal layer 210, for example a platinum layer having a thickness of several nanometres and intended to reflect the laser radiation, and a second layer 310 transparent with regard to the laser radiation intended to be used to disjoin the two substrates 102, 112, this second layer 310 comprising for example alumina $Al_2O_3$ and a thickness of several nanometres. The assembly obtained according to this third embodiment is schematically represented in FIG. 8.

Figure 8:
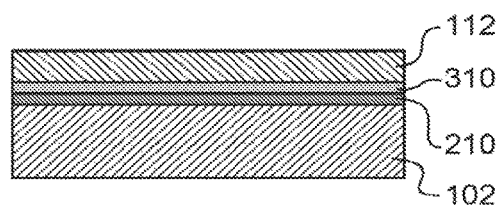
FIG. 8 represents an assembly obtained during the implementation of a method for reversible bonding according to a third embodiment.

To separate the substrates 102, 112 in the configuration such as represented in FIG. 8, an irradiation by direct laser of the assembly is carried out through the second substrate 112 which is transparent with regard to the laser radiation used, in order to reach the bonding interface composed of the bilayer Pt 210/$Al_2O_3$ 310. The laser used here emits in the ultraviolet and corresponds for example to an excimer laser emitting at a wavelength of 248 nm. On account of the different absorption properties between alumina and platinum with regard to the laser beam, the alumina layer may be dismantled mechanically. In fact, platinum is absorbent with regard to the laser beam used (absorption greater than around 65% at 248 nm) unlike alumina (absorption less than around 1% at 248 nm). Such a controlled laser projection leads to localised heating causing an ablation of the alumina layer. The energy density of the laser used is controlled in order not to deteriorate the platinum metal and to enable a total ablation of the transparent alumina layer.

Advantageously, the irradiation by laser may be carried out through the first substrate 102. In this case, the layer 310 is arranged against the first substrate 102.

When micro-batteries 118 are produced on the second substrate 112, the stack of active layers of the micro-batteries 118, notably the metal layer forming the current collectors, may be used as blocking and/or reflecting surface of the laser beam. The laser irradiation is carried out in this case through the rear face of the first substrate 102, inducing an ablation of the transparent alumina layer localised under the active components 118.

The invention claimed is:

1. A method for reversible bonding between a first element and a second element, comprising at least:
   a) producing at least one oxide layer on at least one first face of the first element or at least one first face of the second element;
   b) joining the at least one first face of the first element with the at least one first face of the second element such that the oxide layer forms a bonding interface between the first element and the second element; and
   c) disjoining the second element with regard to the first element by the application of a heat treatment under a controlled humid atmosphere to physically and/or chemically degrade the oxide layer.

2. The method according to claim 1, wherein at least:
   at least one of the first and second elements corresponds to a substrate, or
   at least one of the first and second elements comprises at least one of the following materials: glass, semiconductor, ceramic, or
   the first element has a thickness greater than or equal to around 500 μm, or
   the second element has a thickness less than around 500 μm.

3. The method according to claim 1, further comprising, before step a), the formation of at least one opening through at least one of the first and second elements.

4. The method according to claim 1, further comprising, between steps b) and c), the implementation of a step of treating at least one of the first and second elements.

5. The method according to claim 4, wherein at least:
   the treatment step comprises the production of at least one part of at least one microelectronic device on at least one of the first and second elements, or
   the treatment step is implemented at a temperature greater than or equal to around 400° C.

6. The method according to claim 5, wherein the microelectronic device produced corresponds to at least one of the following devices: an energy storage device, an energy recovery device, a display device, a sensor, an actuator.

7. The method according to claim 1, wherein the oxide layer:
   comprises at least one of the following materials: aluminium oxide, titanium oxide, zirconium oxide, zinc oxide, silicon oxide, or
   is deposited over the entire surfaces of at least one of the first and second elements, or
   has a thickness less than or equal to around 100 nm, or
   is deposited by deposition of atomic layers from at least one organometallic precursor and a precursor comprising water molecules.

8. The method according to claim 1, wherein the heat treatment during step c) comprises a heating by laser radiation of the oxide layer.

9. The method according to claim 8, wherein the heat treatment comprises a heating by laser radiation of the oxide layer through one of the first and second elements which is transparent with regard to the laser radiation.

10. The method according to claim 9, wherein the other of the first and second elements comprises at least one layer capable of reflecting and/or absorbing the laser radiation.

11. The method according to claim 1, further comprising at least:
- before step b), the implementation of a plasma treatment, or
- between steps b) and c), the implementation of a heat treatment reinforcing the bonding energy between the first element and the second element, or
- before step c), the application of an electrostatic field on at least one of the first and second elements.

12. The method according to claim 11, wherein the heat treatment reinforcing the bonding energy between the first element and the second element is implemented at a temperature less than around 400° C.

13. The method according to claim 1, wherein the disjoining of the second element with regard to the first element further comprises the application of a mechanical action and/or of a jet of pressurised gas between the first and second elements.

14. The method according to claim 1, wherein the dimensions of the at least one first face of the first element are greater than or equal to those of the at least one first face of the second element.

15. The method of according to claim 1, wherein the heat treatment during step c) is carried out in an atmosphere having a relative humidity of greater than 50%.

16. The method of according to claim 1, wherein the heat treatment during step c) is carried out in an atmosphere having a relative humidity of greater than 80%.

17. The method of according to claim 1, wherein the heat treatment during step c) is carried out in an atmosphere having a relative humidity of greater than 90%.

18. The method of according to claim 1, further comprising at least:
- before step b), the implementation of a plasma treatment, or
- between steps b) and c), the implementation of a heat treatment at a temperature less than around 400° C. to reinforce the bonding energy between the first element and the second element, or
- before step c), the application of an electrostatic field on at least one of the first and second elements.
- wherein the heat treatment under controlled the humid atmosphere is carried out in an atmosphere having a relative humidity of greater than 80%.

19. A method for reversible bonding between a first element and a second element, comprising at least:
a) producing at least one oxide layer on at least one first face of the first element or at least one first face of the second element;
b) joining the at least one first face of the first element with the at least one first face of the second element such that the oxide layer forms a bonding interface between the first element and the second element; and
c) disjoining the second element with regard to the first element by the application of a heat treatment under a controlled humid atmosphere to physically and/or chemically degrade the oxide layer,
wherein the heat treatment under humid atmosphere modifies a surface roughness of the oxide layer leading to a crumbling thereof.

* * * * *